(12) United States Patent
Nagase

(10) Patent No.: US 6,232,654 B1
(45) Date of Patent: May 15, 2001

(54) SEMICONDUCTOR MODULE

(75) Inventor: Toshiaki Nagase, Aichi (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 0 days.

(21) Appl. No.: 09/349,373

(22) Filed: Jul. 8, 1999

(30) Foreign Application Priority Data

Jul. 10, 1998 (JP) .................................................. 10-195974

(51) Int. Cl.$^7$ .................................................. H01L 23/48
(52) U.S. Cl. ........................... 257/678; 257/785; 257/691
(58) Field of Search .................................. 257/678, 691, 257/785, 147, 724

(56) References Cited

U.S. PATENT DOCUMENTS 5,347,158 * 9/1994 Matsuda et al. ..................... 257/691
5,652,467 * 7/1997 Onose et al. ......................... 257/785

FOREIGN PATENT DOCUMENTS 11-003971    1/1999   (JP) .

* cited by examiner

*Primary Examiner*—Don Wong
*Assistant Examiner*—James Clinger
(74) *Attorney, Agent, or Firm*—Morgan & Finnegan, LLP

(57) ABSTRACT

A semiconductor module includes a MOSFET chip and a package for accommodating the MOSFET chip. The drain area of the MOSFET chip is connected to a base substrate. A source and a gate electrode are arranged on the top of the package, and also a drain electrode to be connected to the base substrate is arranged. On a printed-circuit board, to which a protection circuit is implemented, holes corresponding to the drain electrode, the source electrode, and the gate electrode are formed. The protection circuit is attached to the semiconductor module while the electrodes penetrate into the respective holes.

11 Claims, 8 Drawing Sheets

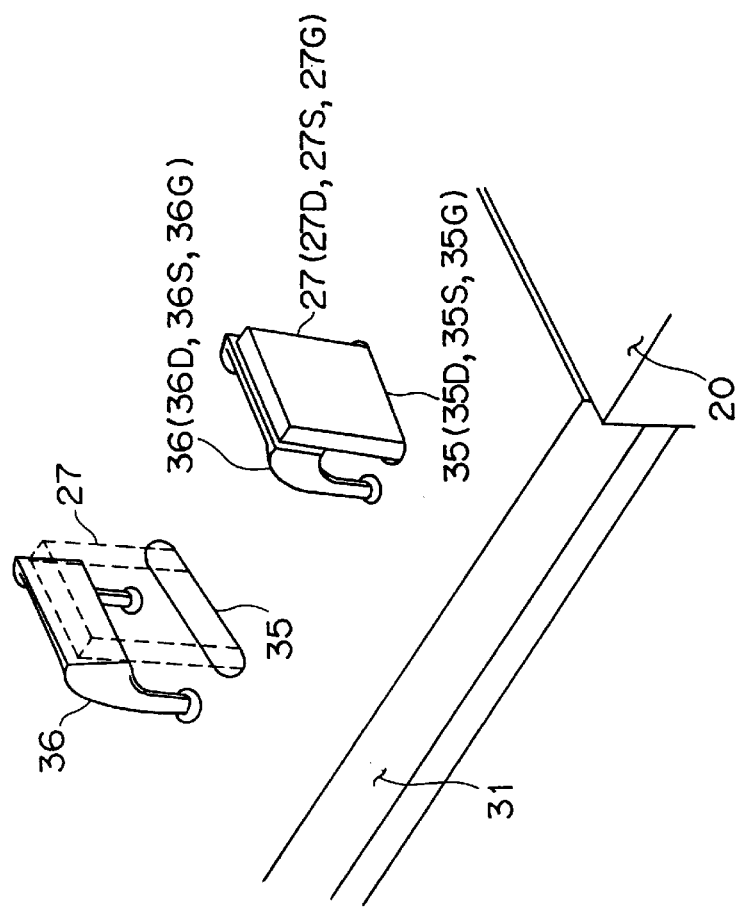
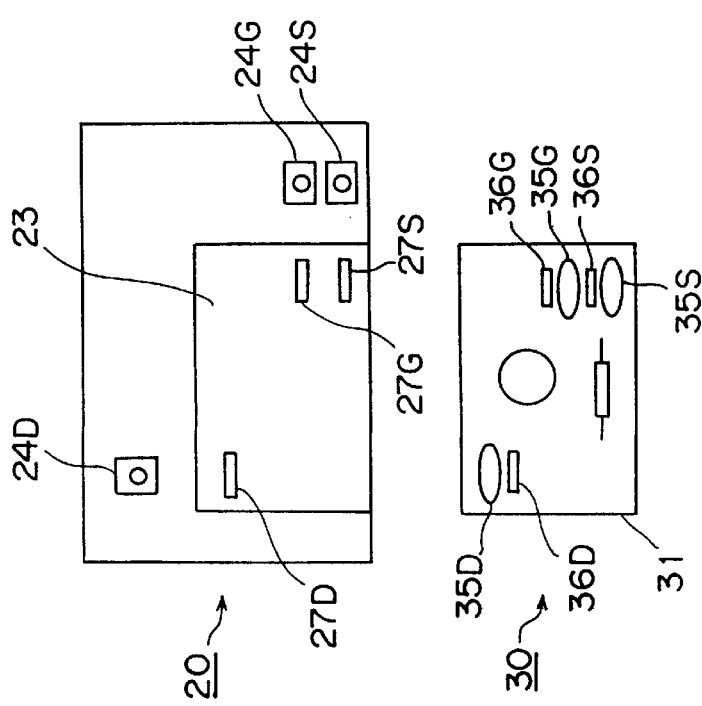
FIG. 7A
FIG. 7B

SEMICONDUCTOR MODULE

BACKGROUND OF THE INVENTION

1. Field of the Invention

The present invention relates to a semiconductor module used to control a high electric current, and more particularly to a non-insulating semiconductor module to which a protection circuit for protecting an internal circuit can be attached.

2. Description of the Related Art

A semiconductor module is widely used not only to process control signals but also to control high currents. For example, in a controlling device which drives a motor for running an electromotive car such as a battery-powered forklift, etc., a semiconductor module with a large electric capacity is used as a switching device arranged between the battery and the motor at the last stage of a controlling circuit.

As a semiconductor module of this type, a variety of configurations are known: a configuration where a large electric current capacity is obtained by connecting a lot of identical power semiconductor chips in parallel; a configuration where simple circuitry is formed by using several types of a semiconductor chip; a configuration where a driving circuit of a semiconductor chip is included, etc.

A semiconductor module, especially a power semiconductor module is normally formed by putting the above described semiconductor chips into a resinous package. A package is normally made of plastic, and its internal semiconductor chip is insulated by ceramic, etc. The vacant space within the package is filled with gel or epoxy resin, etc. in order to prevent the semiconductor chip and its peripheral circuits from being oxidized.

Since a high current flows into the power semiconductor module, the amount of generated heat becomes large. Accordingly, its heat radiation must be considered. As one configuration for radiating the heat of a semiconductor module, a method for mounting a semiconductor module on a base substrate with a large thermal capacity and a high radiation effect (that is, with high thermal conductivity) is frequently adopted. In this case, the heat generated by the semiconductor module is radiated via the base substrate.

FIG. 1 exemplifies a perspective view of the internal structure of a semiconductor module. Here, a MOSFET is shown as an example.

A semiconductor module 1 comprises a plurality of semiconductor chips 2. The plurality of semiconductor chips 2 are mounted on the upper surface of a base substrate 3. The bottom of each of the semiconductor chips 2 is a drain area, and the base substrate 3 is a conductor (metal plate). Accordingly, the base substrate 3 is used as a drain electrode of the semiconductor module 1. The semiconductor module having this configuration is sometimes referred to as a non-insulating semiconductor module.

A source electrode 4 and a gate electrode 5 are arranged on the upper surface of the base substrate 3. Insulating plates 7 are respectively arranged between the source electrode 4 and the base substrate 3 and between the gate electrode 5 and the base substrate 3. The source electrode 4 and the gate electrode 5 are respectively connected to the source and the gate areas of each of the semiconductor chips 2 by bonding wires 8.

The semiconductor module is included in the package as described above. The source electrode 4 and gate electrode 5 protrude from the top of the package to its outside so that they can be connected to external circuits, although this is not show in this figure. The drain electrode is the base substrate 3 as described above, and is located on the bottom of the semiconductor module. As stated above, the drain electrode of the non-insulating semiconductor module is normally located on the bottom of the package, while the other electrodes are located on the top of the package.

If a control signal is applied to the gate electrode 5 on the semiconductor module 1 having the above described configuration, each of the semiconductor chips 2 are turned on. As a result, a main current flows from the drain electrode (base substrate) 3 to the source electrode 4 via the bottoms of the semiconductor chips 2, the tops of the semiconductor chips 2, and the bonding wires 8.

When a semiconductor device is switched (especially, when a transistor is turned off), a surge voltage occurs. Additionally, since the inductor (inductance) caused by the bonding wires, etc. exists in the semiconductor module 1, a considerably large surge voltage may sometimes occur when the semiconductor chips 2 are turned off. Such a surge voltage damages the semiconductor chips electrically and thermally.

To protect the semiconductor chips 2 from the above described surge voltage, a protection circuit such as a snubber circuit, etc. is frequently arranged. The snubber circuit has, for example, the configuration shown in FIG. 2, and absorbs a surge voltage.

FIG. 3 shows the configuration of the semiconductor module and its protection circuit. A protection circuit 11 is arranged at the side of the semiconductor module 1. Additionally, the protection circuit 11 is, for example, the snubber circuit shown in FIG. 2. In this case, the protection circuit 11 must be connected to the source and the drain electrodes of the semiconductor module 1. In the example shown in FIG. 3, the protection circuit 11 and the source electrode 4 are connected by a wire 12, while the protection circuit 11 and the base substrate 3 being the drain electrode are connected by a wire 13. It may be configured that the base substrate 3 is connected to a good conductor 14 such as an aluminum block, etc., and the protection circuit 11 and its good conductor 14 are connected instead of directly connecting the protection circuit 11 and the base substrate 3.

However, the source electrode 4 of the semiconductor module 1 having the above described configuration is arranged above the package, and the base substrate 3 being the drain electrode is arranged below the package. Therefore, the lengths of the wires 12 and 13 cannot be shorter than a predetermined length. As is well known, as the lengths of the wires 12 and 13 become longer, their inductances become larger. When the inductances increase, the capability of the protection circuit 11 for absorbing a surge voltage deteriorates.

As described above, in the conventional configuration, the capability of the protection circuit 11 cannot be fully exhibited, so that a surge voltage is not sufficiently absorbed in some cases. An attempt to improve the capability of the protection circuit 11 causes the size or the cost of the circuit itself to increase.

Furthermore, if the protection circuit 11 is arranged at the side of the semiconductor module 1, the area for arranging the protection circuit 11 naturally becomes wider, which hinders a device size reduction.

SUMMARY OF THE INVENTION

The object of the present invention is to provide a semiconductor module with a protection circuit thereof, a performance of the protection circuit being improved.

A semiconductor module according to the present invention comprises a semiconductor chip and a package for accommodating the semiconductor chip. This module further comprises a first through third electrodes and a protection circuit. The first electrode is arranged on the top of the package, and is used to flow the main current of the semiconductor chip. The second electrode is arranged on the bottom of the package and is used to flow the main current of the semiconductor chip. The third electrode is arranged on the top of the package, and is electrically connected to the second electrode. The protection circuit protects the semiconductor chip, and is directly connected to the first and the third electrodes.

The first and the third electrodes are arranged on the top of the package, and the protection circuit is directly connected to the first and the third electrodes. Therefore, the inductance of a path connecting the protection circuit to the semiconductor chip is small, when the circuit is arranged on the top of the package. As a result, the capability of the protection circuit never deteriorates due to the wire inductance.

If the above described semiconductor chip is a MOSFET, the first electrode corresponds to a source electrode, while the second and the third electrodes correspond to a drain electrode.

BRIEF DESCRIPTION OF THE DRAWINGS

FIG. 7A is a top view of a semiconductor module according to another preferred embodiment and its protection circuit;

FIG. 7B is a perspective view of the semiconductor module according to the another preferred embodiment and its protection circuit.

DESCRIPTION OF THE PREFERRED EMBODIMENTS

Figure 4:
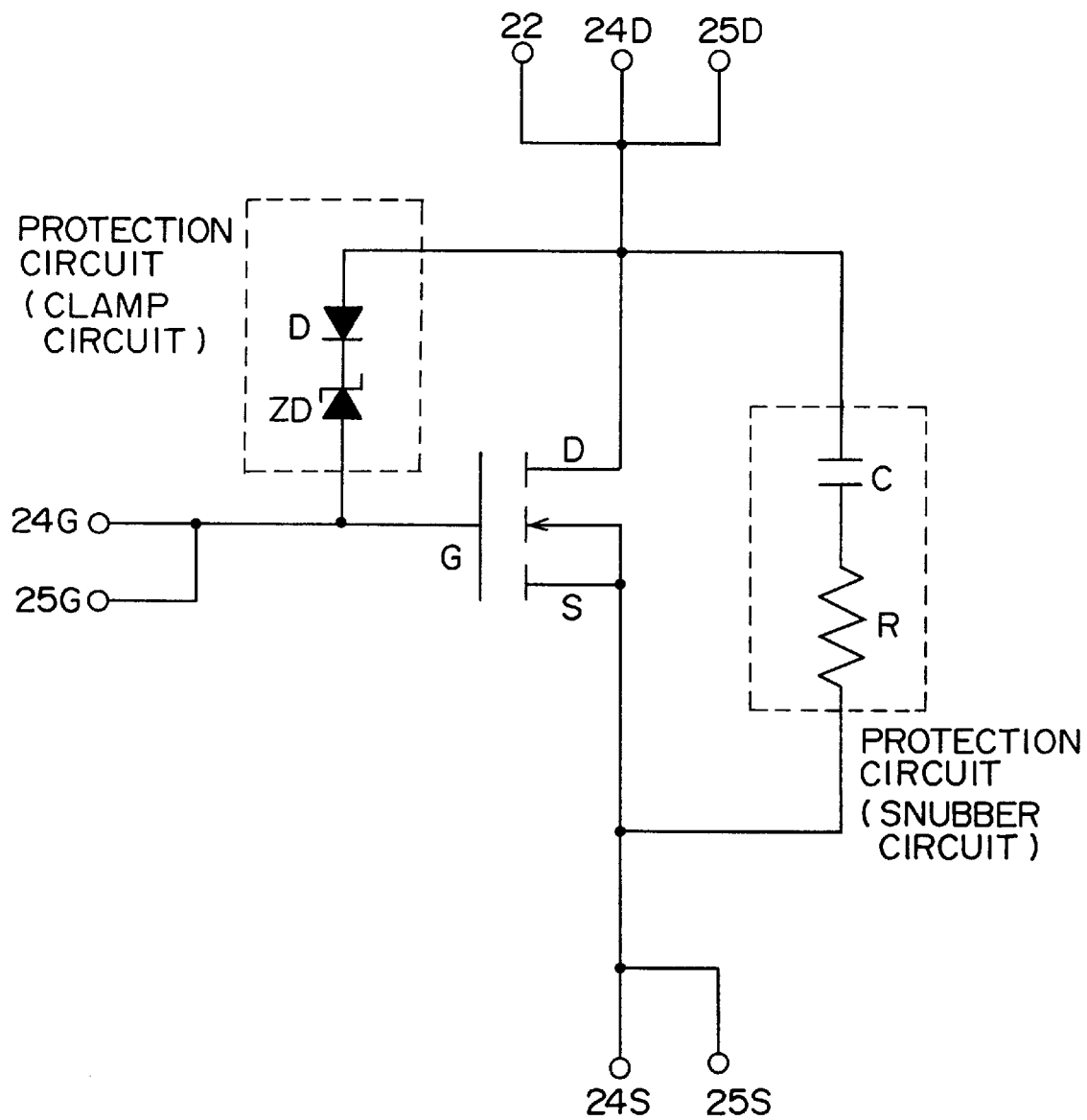
FIG. 4 is a circuit diagram showing the configuration of a semiconductor module according to a preferred embodiment of the present invention, and a protection circuit for protecting the semiconductor module.

FIG. 4 is a circuit diagram showing the configuration of a semiconductor module according to a preferred embodiment of the present invention, and a protection circuit for protecting the semiconductor module. In this preferred embodiment, the semiconductor module is implemented by a MOSFET, while its protection circuit is implemented by a snubber circuit and a clamp circuit. Actually, the MOSFET is configured by connecting many identical MOSFET elements in parallel. The snubber circuit includes a resistor and a capacitor, and absorbs the surge voltage applied to a drain D. The clamp circuit includes a diode and a Zener diode, and flows an electric current in a direction from the drain D to a gate G, when a surge voltage is applied to the drain D. As a result, the electric potential of the gate G rises to turn on the MOSFET. By turning on the MOSFET, the electric potential of the drain D drops, so that the destruction between the drain D and the source S can be prevented.

Figures 5A, 5B:
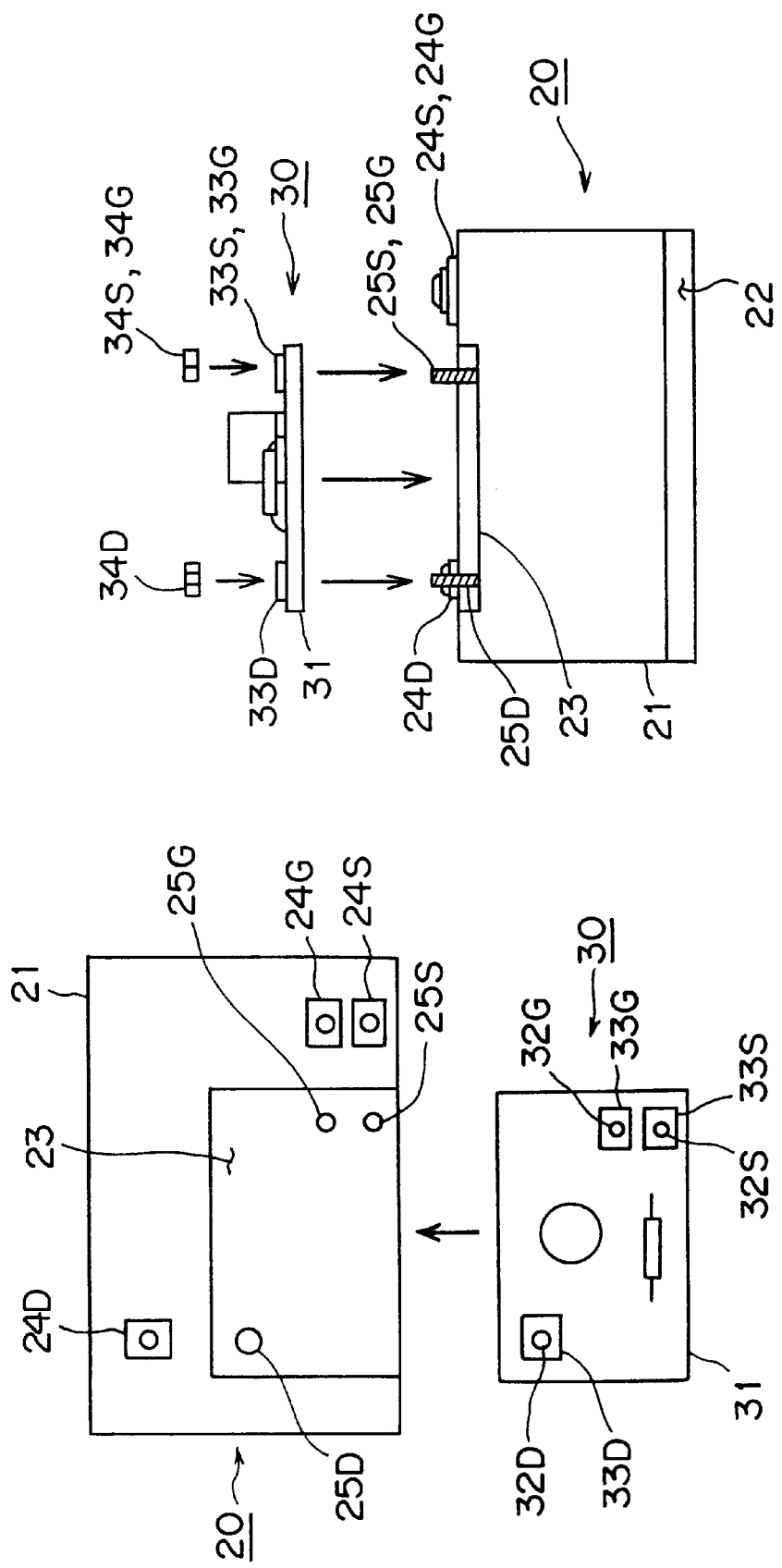
FIG. 5A is a top view of the semiconductor module according to the preferred embodiment and its protection circuit.
FIG. 5B is a side view of the semiconductor module according to the preferred embodiment and its protection circuit.

FIG. 5A is a top view of the semiconductor module according to this preferred embodiment and its protection circuit, while FIG. 5B is a side view of the semiconductor module according to this preferred embodiment and its protection circuit. These figures illustrate the state where a protection circuit 30 is attached to top of a semiconductor module 20.

Figure 1:
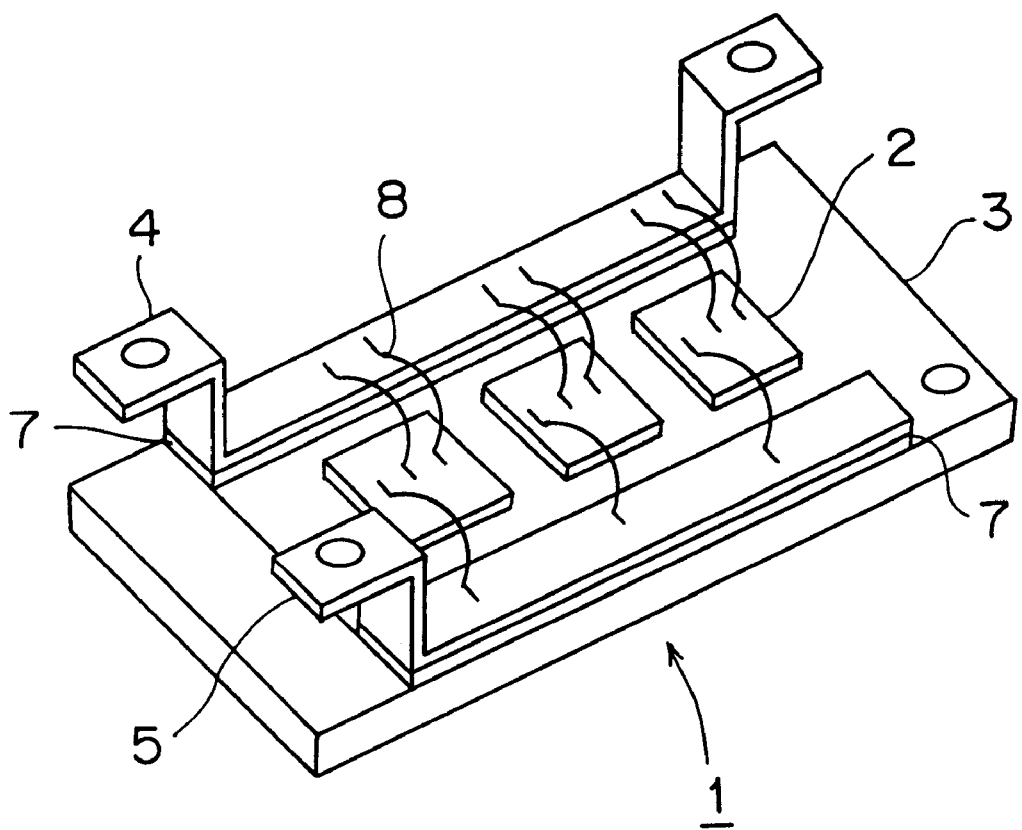
FIG. 1 exemplifies a perspective view of an internal structure of a semiconductor module.
Figure 2:
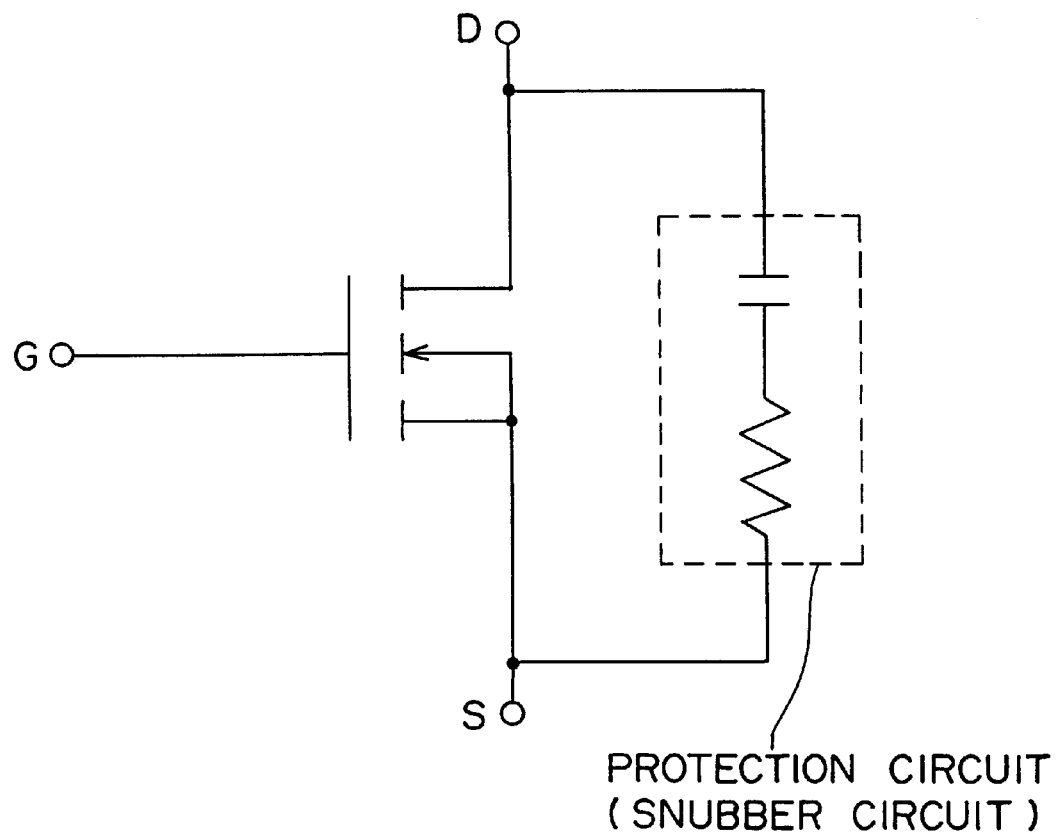
FIG. 2 exemplifies a protection circuit.

A package 21 accommodates the MOSFET shown in FIG. 4. A base substrate 22 to which the drain area of the MOSFET is connected is arranged below the package 21. The base substrate 22 is fundamentally the same as the substrate 3 explained by referring to FIG. 1. An attachment area for attaching the protection circuit 30 is arranged on the top of the package 21.

Additionally, a drain electrode 24D, a source electrode 24S, and a gate electrode 24G are arranged on the top of the package 21. The drain electrode 24D and the source electrode 24S serve as a main current inputting electrode and a main current outputting electrode of the semiconductor module, respectively. The gate electrode 24G serves as a semiconductor module controlling electrode. The source electrode 24S and the gate electrode 24G are respectively connected to the source and the gate areas of the MOSFET. These connection configurations are, for example, the same as those shown in FIG. 1. The drain electrode 24D is connected to the drain area of the MOSFET via the base substrate 22, and this will be described in detail later.

In the attachment area 23, a drain electrode 25D, a source electrode 25S, and a gate electrode 25G are arranged. The drain electrode 25D, the source electrode 25S, and the gate electrode 25G are respectively connected to the drain electrode 24D, the source electrode 24S, and the gate electrode 24G. Notice that the drain electrode 25D, the source electrode 25S, and the gate electrode 25G and the drain electrode 24D, the source electrode 24S, and the gate electrode 24G are closely arranged so that the conductive paths therebetween are the shortest. At the tips of the drain electrode 25D, the source electrode 25S, and the gate electrode 25G, screws are respectively formed.

The drain electrode 24D, the source electrode 24S, and the gate electrode 25G are used to connect the MOSFET included in the package 21 and external circuits, while the drain electrode 25D, the source electrode 25S, and the gate electrode 25G are used to connect the MOSFET and the protection circuit 30. Because the drain electrode 25D and the source electrode 25S are not directly connected to external circuits as described above, it may not be said that they are true electrodes for flowing a main current. However, the drain electrode 25D and the source electrode 25S are respectively connected to the drain electrode 24D and the source electrode 24S as shown in FIG. 4. Therefore, they can be regarded as being portions of the input and output electrodes of a main current.

The protection circuit 30 is configured, for example, by a printed-circuit board 31, and various types of components (such as a resistor, a capacitor, a diode, etc.), which are mounted on the printed-circuit board 31. In this preferred embodiment, the protection circuit 30 is the snubber circuit and the clamp circuit, which are shown in FIG. 4.

On the printed-circuit board 31, holes 32D, 32S, and 32G are arranged at the positions which respectively correspond to the drain electrode 25D, the source electrode 25S, and the gate electrode 25G. Namely, the drain electrode 25D, the source electrode 25S, and the gate electrode 25G respectively penetrate into the holes 32D, 32S, and 32G, when the protection circuit 30 is attached to the attachment area 23 of the semiconductor module 20.

Conductors 33D, 33S, and 33G are formed in the vicinity of the holes 32D, 32S, and 32G. These conductors 33D, 33S, 33G are connected to the snubber circuit or the clamp circuit, for example, by the wiring patterns formed onto the printed-circuit board 31. In this preferred embodiment, the conductor 33D is connected to a capacitor C and the anode of a diode D. The conductor 33S is connected to a resistor R. The conductor 33G is connected to the anode of a Zener diode ZD.

When the protection circuit 30 is attached to the semiconductor module 20, the drain electrode 25, the source electrode 25S, and the gate electrode 25 are secured by nuts 34D, 34S, and 34G, while the electrodes penetrate into the holes 32D, 32S, and 32G, respectively. The nuts 34D, 34S, and 34G are formed by a material with high conductivity. In this way, the drain electrode 25D, the source electrode 25S, and the gate electrode 25G are electrically connected to the conductors 33D, 33S, and 33G. As a result, the circuit shown in FIG. 4 is configured.

Figure 6A:
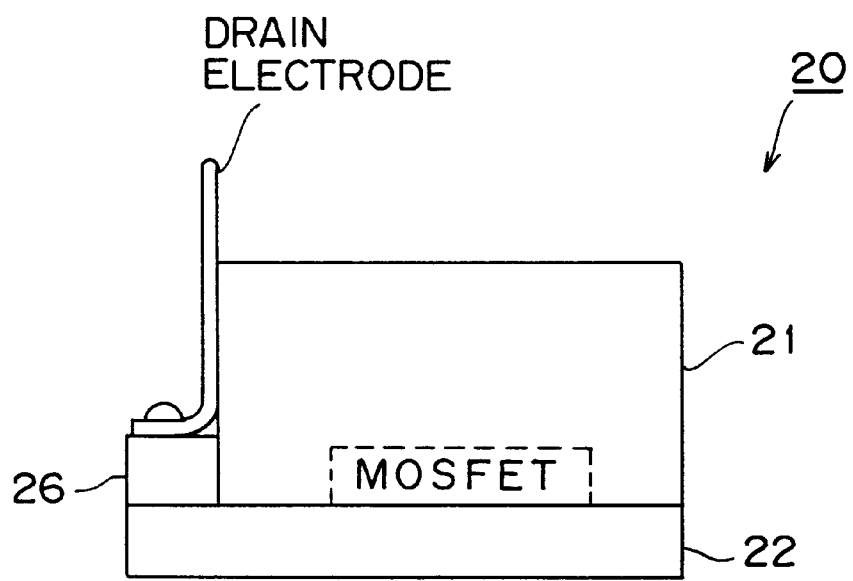
FIGS. 6A and 6B explain the method for installing a drain electrode.
Figure 6B:
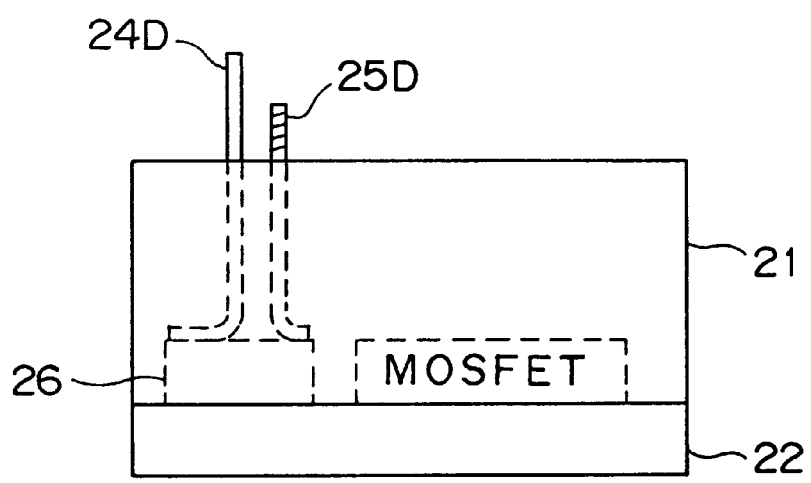

FIGS. 6A and 6B explain the method for installing a drain electrode. The drain area of the MOSFET according to this preferred embodiment is connected to the base substrate 22, as described above. Accordingly, if a drain electrode is arranged in an upper portion of the semiconductor module 20, an aluminum block 26 with high conductivity is connected to the base substrate 22, and a drain electrode is securely disposed to the aluminum block 26, as shown in FIG. 6A. With such a configuration, no bonding or lead wire exists on the path from the drain area of the MOSFET to the drain electrode. Consequently, the inductance of this path does not become large.

The drain electrodes 24D and 25D can be connected to the base substrate 22 with a similar method, as shown in FIG. 6B. Accordingly, the inductance of the path from the drain area of the MOSFET to the drain electrodes 24D and 25D does not become large.

In the above described configuration, the protection circuit 30 is directly connected to the drain electrode 25D, the source electrode 25S, and the gate electrode 25D. That is, the path connecting the MOSFET of the semiconductor module 20 and the protection circuit 30 becomes the shortest. Consequently, the wire inductance of this path is significantly reduced in comparison with the conventional configuration shown in FIG. 3, so that the capability of the protection circuit 30 (especially, the surge voltage absorption ability of the snubber circuit) can be improved. As a result, the protection circuit 30 can be reduced in size and cost.

It is optimum that the connection between the semiconductor module 20 and the printed-circuit substrate 31 of the protection circuit 30 is made in the linearly shortest distance as described above, in consideration of only the suppression effect of a surge voltage. However, this connection may be made in various ways, taking account of the locations of semiconductor chips or electrodes within the package 21. Even if the connection is made in different ways, sufficient surge voltage suppression can be promised when compared with the conventional configuration.

Additionally, the protection circuit 30 is arranged in the upper portion of the semiconductor module 20 in the above described configuration, which eliminates the need for arranging an extra area for which the protection circuit 30 is attached. Therefore, the space of the entire configuration in which the semiconductor module 20 and the protection circuit 30 are combined can be significantly reduced.

Figure 3:
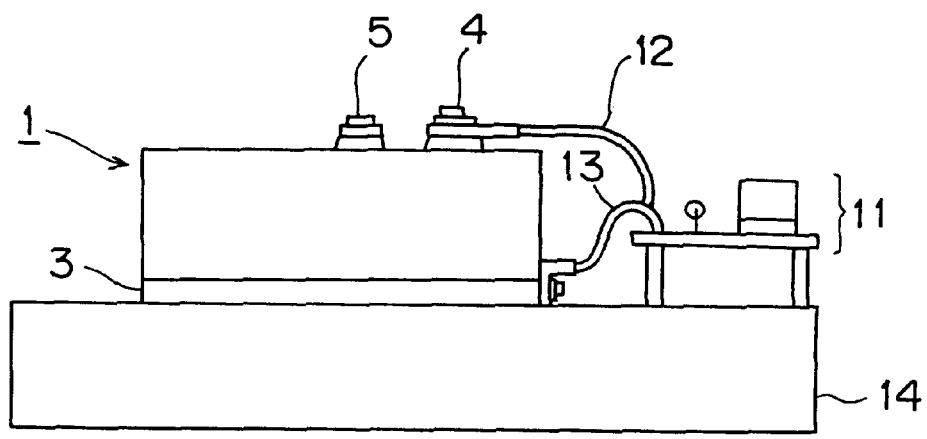
FIG. 3 shows the configuration of the semiconductor module and its protection circuit in a conventional module.

In a conventional mudule, since a support member for electric insulation between the base substrate and the protection circuit is arranged as shown in FIG. 3, the semiconductor module is susceptible to shaking or shock. The semiconductor module according to this preferred embodiment, however, becomes less susceptible to shaking or shock, because the protection circuit 30 is directly secured to the semiconductor module 20 using screws formed at the tips of the drain electrodes 25D, the source electrode 25S, and the gate electrode 25G and nuts 34D, 34S, and 34G. In addition, the semiconductor module 20 and the protection circuit 30 are joined with bolts and nuts, so that the protection circuit 30 can be easily attached/detached to/from the semiconductor module 20. That is to say, the protection circuit 30 can be easily replaced with another one.

The above described preferred embodiment refers to the configuration where the semiconductor module 20 and the protection circuit 30 are joined with bolts and nuts. However, the present invention is not limited to this configuration.

FIG. 7A is a top view of a semiconductor module according to another preferred embodiment and its protection circuit, while FIG. 7B is a perspective view of the semiconductor module according to the another preferred embodiment and its protection circuit.

Unlike the drain electrode 25D, the source electrode 25S, and the gate electrode 25G, which are shown in FIG. 5A, the drain electrode 27D, the source electrode 27S, and the gate electrode 27G are formed as plates. Additionally, holes 35D, 35S, and 35G are arranged at the positions which respectively correspond to the drain electrode 25D, the source electrode 25S, and the gate electrode 25G on the printed-circuit board 31 of the protection circuit 30. Namely, when the protection circuit 30 is attached to the attachment area 23 of the semiconductor module 20, the drain electrode 27, the source electrode 27S, and the gate electrode 27G penetrate into the holes 35D, 35S, and 35G, respectively.

Terminals 36D, 36S, and 36G are arranged on the vicinity of the holes 35D, 35S, and 35G, respectively. These terminals 36D, 36S, and 36G are connected to a snubber circuit or a clamp circuit similar to the conductors 33D, 33S, and 33G, which are shown in FIG. 5A.

When the protection circuit 30 is attached to the semiconductor module 20, the drain electrode 27D, the source electrode 27S, and the gate electrode 27G are respectively connected to the terminals 36D, 36S, and 36G, while the drain electrode 27D, the source electrode 27S, and the gate electrode 27G penetrate into the holes 35D, 35S, and 35G, respectively. The electrodes and the terminals are connected by soldering or welding. With this configuration, the electric connections between the electrodes and the terminals can be much more secured.

The above described preferred embodiment adopts the snubber circuit and the clamp circuit as the protection circuit. However, the present invention is not limited to this implementation. Namely, the present invention is also applicable to other protection circuits except for the protection circuit shown in FIG. 4. Additionally, the present invention is not limited to the protection circuit for protecting a semiconductor module. This invention is also applicable to an auxiliary circuit relating to the operations of a semiconductor module. Note that, however, the present invention is especially useful when a circuit to be attached to a semiconductor module is connected to both of a drain electrode and other electrodes, in the semiconductor module where the base substrate of a semiconductor chip is used as the drain electrode and the other electrodes are arranged in an upper portion of a package.

Furthermore, in the above described preferred embodiment, two electrodes are arranged for each semiconductor area (for example, the drain electrodes 24D and 25D are arranged for drain), the present invention is not always limited to this configuration. That is, all of the numbers of drain electrodes, source electrode, and gate electrodes may be 1.

Figure 8:
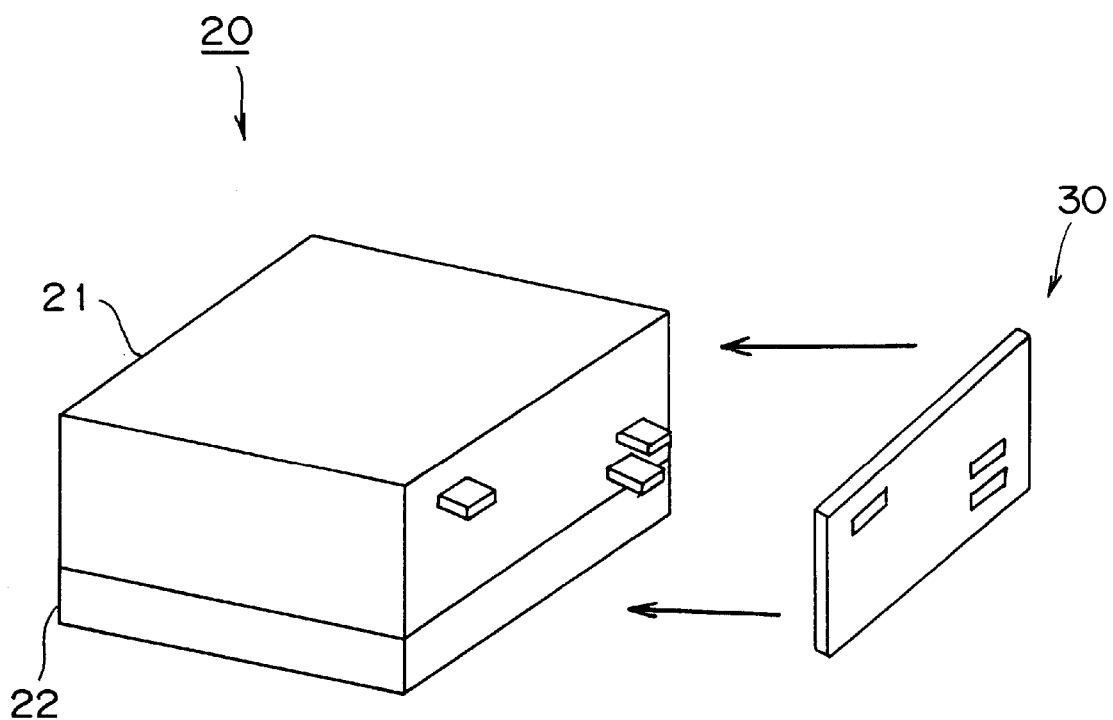
FIG. 8 is a perspective view of the configuration of a semiconductor module according to a further preferred embodiment and its protection circuit.

Still further, the respective electrodes are arranged on and above the package of the semiconductor module in the above described preferred embodiment. However, the present invention is not limited to this configuration. By way of example, it may be configured that a drain electrode, a source electrode, and a gate electrode are arranged at the side of the package 21 of the semiconductor module 20, and the protection circuit 30 is attached by using these electrodes, as shown in FIG. 8.

Still further, the above described preferred embodiments are explained by adopting a MOSFET as an example of a semiconductor chip. However, other semiconductor elements (such as various types of transistors, thyristors, etc.) may be utilized.

As described above, according to the present invention, the capability of the protection circuit for protecting a semiconductor module is improved. Therefore, a small-sized and low-cost protection circuit can be used, thereby reducing space and cost.

Consequently, it becomes possible to reduce in heat generation and power loss while a semiconductor module is operating, whereby a heat sink to be connected for radiating heat can be reduced in size and the number of semiconductor chips can be reduced. As a result, the reliability of the semiconductor module can be improved, and its manufacturing cost can be reduced.

What is claimed is:

1. A semiconductor module including a semiconductor chip and a package for accommodating the semiconductor chip, comprising:
    a first electrode, which is arranged on the top of the package, flowing the main current of the semiconductor chip;
    a second electrode, which is arranged on the bottom of the package, flowing the main current of the semiconductor chip;
    a third electrode, which is arranged on the top of the package and is electrically connected to said second electrode; and
    a protection circuit for protecting the semiconductor chip, wherein
    said protection circuit is mounted on the top of the package and directly connected to said first electrode and said third electrode.

2. The semiconductor module according to claim 1, wherein said second electrode is a conductive substrate, and one of semiconductor areas through which the main current of the semiconductor chip flows is connected to said second electrode.

3. The semiconductor module according to claim 1, wherein said protection circuit can be attached/detached to/from the semiconductor module.

4. The semiconductor module according to claim 3, wherein:
    screws are formed at tips of said first electrode and said third electrode; and
    said protection circuit is secured to said first electrode and said third electrode by using nuts and the screws formed at the tips of said first electrode and said third electrode.

5. The semiconductor module according to claim 1, wherein:
    said protection circuit comprises terminals which respectively correspond to said first electrode and said third electrode; and
    said first electrode and said third electrode are electrically connected to respectively corresponding terminals.

6. The semiconductor module according to claim 5, wherein said first electrode and said third electrode are electrically connected to respectively corresponding terminals by being soldered or welded.

7. The semiconductor module according to claim 1, wherein:
    a fourth electrode for inputting a control signal to the semiconductor chip is further arranged on the top of the package; and
    said protection circuit is directly connected to said first electrode, said third electrode, and said fourth electrode.

8. The semiconductor module according to claim 1, wherein said protection circuit is a snubber circuit for absorbing a surge voltage applied to the semiconductor chip.

9. A semiconductor module including a semiconductor chip and a package for accommodating the semiconductor chip, comprising:
    a first electrode, which is arranged on the top of the package, for flowing the main current of the semiconductor chip;
    a second electrode, which is arranged on the bottom of the package, for flowing the main current of the semiconductor chip;
    a third electrode, which is arranged on the top of the package and is electrically connected to said second electrode; and
    a protection circuit, mounted on the top of the package, for protecting the semiconductor chip, wherein
    said first electrode and said third electrode are formed so that the protection circuit is directly connected thereto.

10. A semiconductor module including a semiconductor chip and a package for accommodating the semiconductor chip, wherein a mounting area is provided on the top of the package for mounting a protection circuit that protects the semiconductor chip, and a first main current electrode and a second main current electrode to which the protection circuit can be directly connected are arranged on the top of the package.

11. A semiconductor module including a semiconductor chip and a package for accommodating the semiconductor chip, wherein:
    a first main current electrode and a second main current electrode are arranged on the top of the package; and
    a protection circuit mounted on the top of the package, for protecting the semiconductor chip is directly connected to the first main current electrode and the second main current electrode.

* * * * *

UNITED STATES PATENT AND TRADEMARK OFFICE
CERTIFICATE OF CORRECTION

PATENT NO.    : 6,232,654 B1
DATED         : May 15, 2001
INVENTOR(S)   : Toshiaki Nagase It is certified that error appears in the above-identified patent and that said Letters Patent is hereby corrected as shown below:

<u>Title page,</u>
Columns 1 and 2, Item [56], References Cited please change:
"5,347,158  9/1994" to -- 5,347,158  8/1993 --;
"5,652,467  7/1997 to -- 5,652,467  7/1995 --.

<u>Column 8,</u>
Line 62, after "circuit", insert a comma -- , --.

Signed and Sealed this

Nineteenth Day of March, 2002

Attest:

JAMES E. ROGAN
*Director of the United States Patent and Trademark Office*

*Attesting Officer*